United States Patent
Naura et al.

(10) Patent No.: US 7,436,702 B2
(45) Date of Patent: Oct. 14, 2008

(54) INTEGRATED CIRCUIT WITH A DATA MEMORY PROTECTED AGAINST UV ERASURE

(75) Inventors: David Naura, Aix en Provence (FR); Christophe Moreaux, Simiane (FR); Ahmed Kari, Aix en Provence (FR); Pierre Rizzo, Aix en Provence (FR)

(73) Assignee: STMicroelectronics S.A., Montrouge (FR)

( * ) Notice: Subject to any disclaimer, the term of this patent is extended or adjusted under 35 U.S.C. 154(b) by 219 days.

(21) Appl. No.: 11/469,351

(22) Filed: Aug. 31, 2006

(65) Prior Publication Data
US 2007/0058430 A1 Mar. 15, 2007

(30) Foreign Application Priority Data
Sep. 2, 2005 (FR) ................................ 05 08983

(51) Int. Cl.
*G11C 11/34* (2006.01)
(52) U.S. Cl. ................................. 365/185.04
(58) Field of Classification Search ............ 365/185.04, 365/210.1, 210.12, 210.14
See application file for complete search history.

(56) References Cited

U.S. PATENT DOCUMENTS

| | | | | |
|---|---|---|---|---|
| 5,198,997 | A | 3/1993 | Arakawa | 365/185 |
| 6,249,456 | B1 | 6/2001 | Chehadi | 365/185.2 |
| 6,556,476 | B1 * | 4/2003 | Na | 365/185.04 |

FOREIGN PATENT DOCUMENTS

EP 0874369 10/1998

* cited by examiner

*Primary Examiner*—Richard T. Elms
*Assistant Examiner*—Nam Nguyen
(74) *Attorney, Agent, or Firm*—Lisa K. Jorgenson; Robert Iannucci; Seed IP Law Group PLLC

(57) ABSTRACT

A method protects against a global data erasure an integrated circuit comprising an electrically programmable data memory and a control unit to execute commands for reading or writing in the memory. The method includes the steps of providing, in the integrated circuit, electrically programmable reference memory cells, at putting the integrated circuit into service, storing, in the reference memory cells, bits of determined value forming an authorized combination of bits and, during the operation of the integrated circuit following its putting into service, reading and evaluating the reference memory cells and blocking the integrated circuit if the reference memory cells contain a forbidden combination of bits different from the authorized combination.

41 Claims, 4 Drawing Sheets

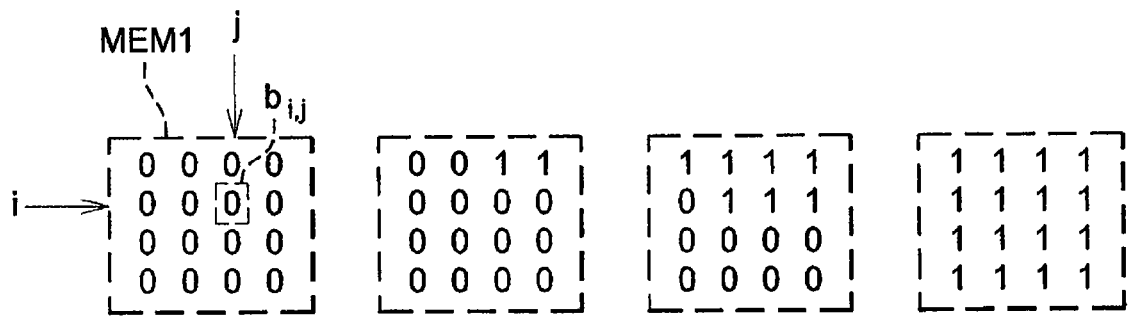
FIG. 1A (Prior Art)  FIG. 1B (Prior Art)  FIG. 1C (Prior Art)  FIG. 1D (Prior Art)
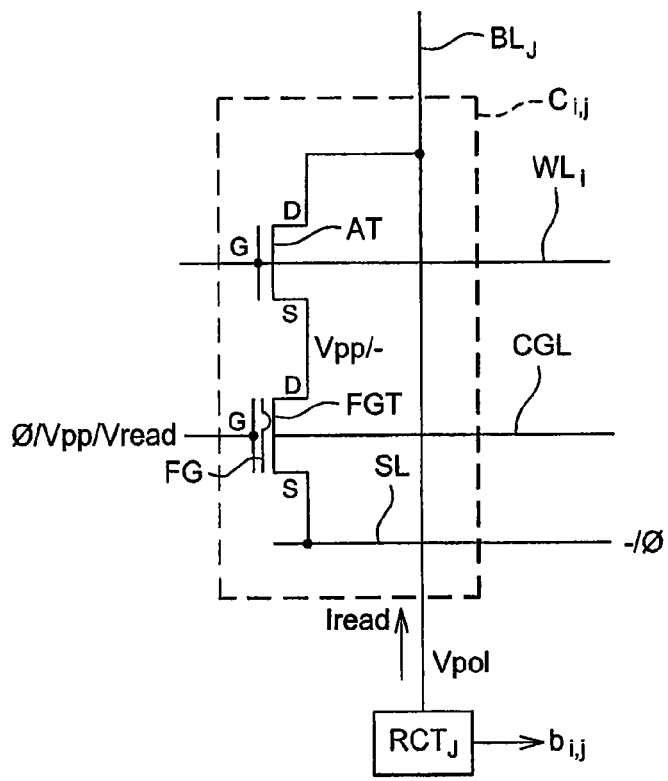
FIG. 2 (Prior Art)
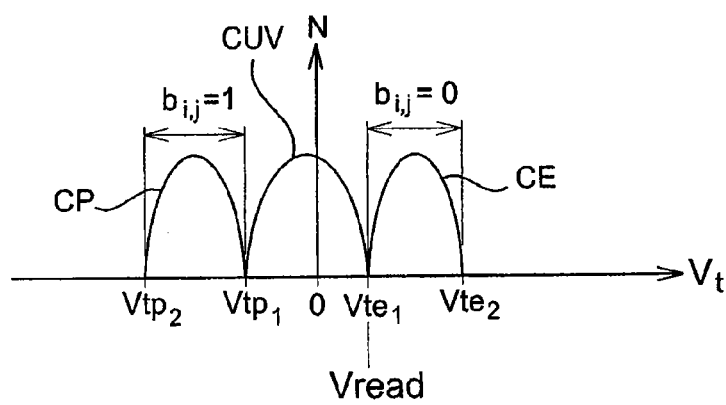
FIG. 3 (Prior Art)

INTEGRATED CIRCUIT WITH A DATA MEMORY PROTECTED AGAINST UV ERASURE

BACKGROUND OF THE INVENTION

1. Field of the Invention

The present invention relates to an integrated circuit comprising an electrically programmable data memory and means for executing commands for reading or writing in the memory.

2. Description of the Related Art

An embodiment of the present invention particularly relates to integrated circuits receiving transaction data, in particular integrated circuits for chip cards like electronic purses, telephone cards, transport cards, etc.

These transaction data having a monetary value and forming kinds of usable "tokens", they are often fraudsters' targets who try to regenerate them after their use. FIGS. 1A to 1D schematically show an example use of a non-volatile memory of the electrically erasable and programmable type MEM1 to form a counter of transaction data, here a counter of the abacus type. Initially, the counter comprises a matrix of bits $b_{i,j}$, each bit having an initial value, for example four lines of bits equal to 0, each bit $b_{i,j}$ belonging to a ith horizontal line and a jth vertical line and representing a transaction unit. Each time a unit is used, a bit is irreversibly set to 1 beginning for example with the first bit on the right of the upper line, then passing from one line to another when the units of a line have been used. FIG. 1B shows the aspect of the counter after 3 units have been used, FIG. 1C the aspect of the counter after 7 units have been used and FIG. 1D the aspect of the counter once all the units have been used.

Each bit $b_{i,j}$ is stored by a memory cell and the change from the initial value of the bit to the "used" value, here from 0 to 1, is obtained by having the memory cell changing from an erased initial state to a programmed state. Thus, a fraudster wishing to regenerate the value of the units counter will try to erase the memory cells in the programmed state so that all the units of the counter are reset to 0. To that end, the erasure technique most commonly used is the collective erasure of memory cells, by exposing the memory MEM1 to a particle beam, usually a UV beam (beam of ultraviolet light). This UV beam has the effect of extracting electric charges from memory cells and bringing them into an electrical state called "UV state".

That will be better understood by referring to FIG. 2 which shows an example of electrically erasable and programmable memory cell $C_{i,j}$ allowing a bit $b_{i,j}$ to be stored. The memory cell $C_{i,j}$ comprises a floating gate transistor FGT and an access transistor AT, both of the NMOS type. The access transistor has a drain terminal D connected to a bit line $BL_j$, a gate G connected to a word line $WL_i$ and a source terminal S connected to a drain terminal D of the transistor FGT. The latter further comprises a floating gate FG, a control gate CG linked to a gate control line CGL, and a source terminal S linked to a source line $SL_i$.

The memory cell $C_{i,j}$ is set into the programmed state for example by applying a voltage Vpp on the drain terminal D of the transistor FGT, via the access transistor AT, and a voltage of lower value, for example 0V, to its control gate CG. Electric charges are injected into the floating gate FG and lower the threshold voltage Vt of the transistor FGT, which generally becomes negative. The memory cell $C_{i,j}$ is set into the erased state for example by applying the voltage Vpp to the control gate CG of the transistor FGT and a voltage of lower value, for example 0V, on its source terminal S. Electric charges are extracted from the floating gate FG and the threshold voltage of the transistor FGT increases to generally become positive.

The reading of the memory cell $C_{i,j}$ is ensured by a read circuit $RCT_j$ linked to the drain terminal D of the transistor FGT via the bit line $BL_j$ and the access transistor AT. The circuit $RCT_j$ applies a bias voltage Vpol to the bit line while a read voltage Vread is applied to the control gate CG of the transistor FGT. If the transistor FGT is in the programmed state, the memory cell is conductive and a read current Iread superior to a determined threshold is flowing through the bit line $BL_j$. The read circuit $RCT_j$ then supplies a bit $b_{i,j}$ whose value is defined by convention, for example 1. If the transistor FGT is in the erased state, the memory cell is not conductive or little conductive and the read circuit $RCT_j$ supplies a bit $b_{i,j}$ of inverse value, here a bit equal to 0.

The read voltage Vread thus plays an important role in determining the value of the bit $b_{i,j}$ and is superior to the threshold voltage Vtp of the transistor FGT in the programmed state and inferior to the threshold voltage Vte of the transistor FGT in the erased state. That appears clearly in FIG. 3 which shows a statistical distribution curve CP of threshold voltages Vtp of memory cells in the programmed state and a statistical distribution curve CE of threshold voltages Vte of memory cells in the erased state, the ordinate axis representing a statistical number N of memory cells. The curve CP is comprised between two negative threshold voltages Vtp1, Vtp2, for example −1.5V and −3.5V, and the curve CE is comprised between two positive threshold voltages Vte1, Vte2, for example 1V and 3V. Between the two distribution curves CE, CP, there is a statistical distribution curve CUV delimited by the threshold voltage Vtp1 on the left and by the threshold voltage Vte1 on the right. This curve CUV represents the statistical distribution of the threshold voltages of memory cells which have been erased by a UV beam and being in the UV state. Thus, the UV erasure does not have the same effect as the electrical erasure, since the cells have threshold voltages neither corresponding to a threshold voltage of an electrically programmed floating gate transistor nor to a threshold voltage of an electrically erased transistor.

The solution usually chosen to counter a fraudulent UV erasure consists in using a read voltage Vread located on the right of the statistical distribution curve CUV, for example the voltage Vte1 in FIG. 3 (the curves CUV, CE being contiguous here). Thus, any memory cell which has been erased by UV and read by the voltage Vread=Vte1 is in the conducting state and is seen by the read circuit as a programmed memory cell.

However, a read voltage that high results in memory cells becoming highly conductive (low serial resistance) during the read phases, and causes an increase of power consumption. Moreover, the read voltage must stabilize and propagate through conducting paths before being applied to memory cells, which implies a not negligible waiting time after powering on the integrated circuit before being able to read data. Lastly, the read voltage being close to the threshold voltages of erased memory cells (curve CE), any shift of the threshold voltage of an erased memory cell beyond the read voltage is rendered by a read error. This solution thus causes the read process to be sensitive to retention loss in the erased memory cells.

Another solution, described by EP 1 006 532, is to provide a reference memory cell which is placed in an erased or programmed initial state and is then read by two read voltages, in order to detect whether the memory cell actually is in the initial state or in an intermediate state corresponding to the UV state. The drawback of this solution is to require two read voltages, one being a "standard" read voltage and the other making it possible to detect whether the memory cell is in the UV state.

BRIEF SUMMARY OF THE INVENTION

One embodiment of the present invention is a method for protecting a data memory against UV erasure which does not require the use of a read voltage superior to the threshold voltage of memory cells in the UV state and which does not require the use of several read voltages.

One embodiment of the invention is a method for protecting against global data erasure in an integrated circuit comprising an electrically programmable data memory and a control unit for executing commands for reading or writing in the memory, comprising steps of providing in the integrated circuit two groups of electrically programmable reference memory cells, each group comprising at least one reference memory cell; when putting the integrated circuit into service, storing in the reference memory cells of a first group bits having a first value and in the reference memory cells of a second group bits having a second value, inverse of the first value, the bits of the first and second groups together forming an authorized combination of bits; during the operation of the integrated circuit after putting it into service, reading and evaluating the reference memory cells, and blocking the integrated circuit if the reference memory cells contain a forbidden combination of bits different from the authorized combination.

According to one embodiment, a combination of bits is forbidden if the memory cells of each group contain bits of the same value.

According to one embodiment, a combination of bits is forbidden if all the reference memory cells of the first group contain bits having the second value and/or if all the memory cells of the second group contain bits having the first value.

According to one embodiment, a combination of bits is forbidden if at least one reference memory cell of the first group contain at least one bit having the second value and if at least one reference memory cell of the second group contain at least one bit having the first value.

According to one embodiment, blocking the integrated circuit comprises blocking the control unit so that it does no longer execute any command.

According to one embodiment, the execution of a command for writing reference memory cells is authorized by the integrated circuit, after putting the integrated circuit into service, to allow the integrated circuit to be voluntarily blocked.

According to one embodiment, the data memory comprises a memory array wherein memory cells of an area of the memory array are used as reference memory cells.

According to one embodiment, the method is applied to an integrated circuit wherein each memory cell of the data memory and each reference memory cell comprise a floating gate transistor, and wherein the memory cells are read with a read voltage whose value is equal to zero.

According to one embodiment, the reference memory cells are read and evaluated each time the integrated circuit is powered on, after putting it into service.

According to one embodiment, the evaluation of memory cells is carried out by means of a wired-logic circuit implementing a logic function of evaluation.

One embodiment of the present invention is an integrated circuit comprising an electrically programmable data memory and a control unit for executing commands for reading or writing in the memory, at least two groups of electrically programmable reference memory cells, each group comprising at least one reference memory cell, and means for blocking the integrated circuit if the memory cells of the two groups contain bits of the same value.

According to one embodiment, the integrated circuit comprises two reference memory cells, and means for blocking the integrated circuit if the two reference memory cells contain two bits of the same value.

According to one embodiment, the integrated circuit comprises at least two groups of reference memory cells, each group comprising at least two reference memory cells, and means for blocking the integrated circuit if all the reference memory cells of a same group contain bits of the same value and if that value is different from a value expected for this group of reference memory cells.

According to one embodiment, the integrated circuit comprises at least two groups of reference memory cells, each group comprising at least two reference memory cells, and means for blocking the integrated circuit if a reference memory cell of a first group contains a bit whose value is different from a value expected for the reference memory cells of the first group, and if a reference memory cell of a second group contains a bit whose value is different from a value expected for the reference memory cells of the second group.

According to one embodiment, the value expected for the bits contained in the memory cells of the first group is the inverse of the value expected for the bits contained in the memory cells of the second group.

According to one embodiment, the means for blocking the integrated circuit comprise means for reading and means for evaluating reference memory cells, activated as a priority at powering on the integrated circuit and providing a block signal for blocking the control unit if the reference memory cells contain a forbidden combination of bits.

According to one embodiment, the integrated circuit comprises means for evaluating reference memory cells comprising a wired-logic circuit implementing a logic function of evaluation.

According to one embodiment, the integrated circuit comprises means for storing an authorized combination of bits in the reference memory cells at putting the integrated circuit into service, and means for subsequently preventing the writing of reference memory cells.

According to one embodiment, the control unit is configured to execute a command for writing a forbidden combination of bits in the reference memory cells, so as to put the integrated circuit out of service.

According to one embodiment, each memory cell of the data memory and each reference memory cell comprises a floating gate transistor and is read by applying a read voltage equal to zero to the floating gate transistor.

According to one embodiment, the data memory comprises a memory array and the reference memory cells are arranged in an allocated area of the memory array.

BRIEF DESCRIPTION OF THE SEVERAL VIEWS OF THE DRAWING

These and other advantages and features of the present invention will be presented in greater detail in the following description of the method according to one embodiment of the invention and of an embodiment of an integrated circuit according to the invention, in relation to, but not limited by the following figures:

FIGS. 1A to 1D previously described show the use of a non-volatile memory as a units counter, FIG. 2 previously described shows an example structure of electrically erasable and programmable memory cell, FIG. 3 previously described shows statistical distribution curves of threshold voltages of memory cells in different states, FIGS. 4A, 4B schematically show an integrated circuit according to one embodiment of the invention.

DETAILED DESCRIPTION OF THE INVENTION

Figure 4A:
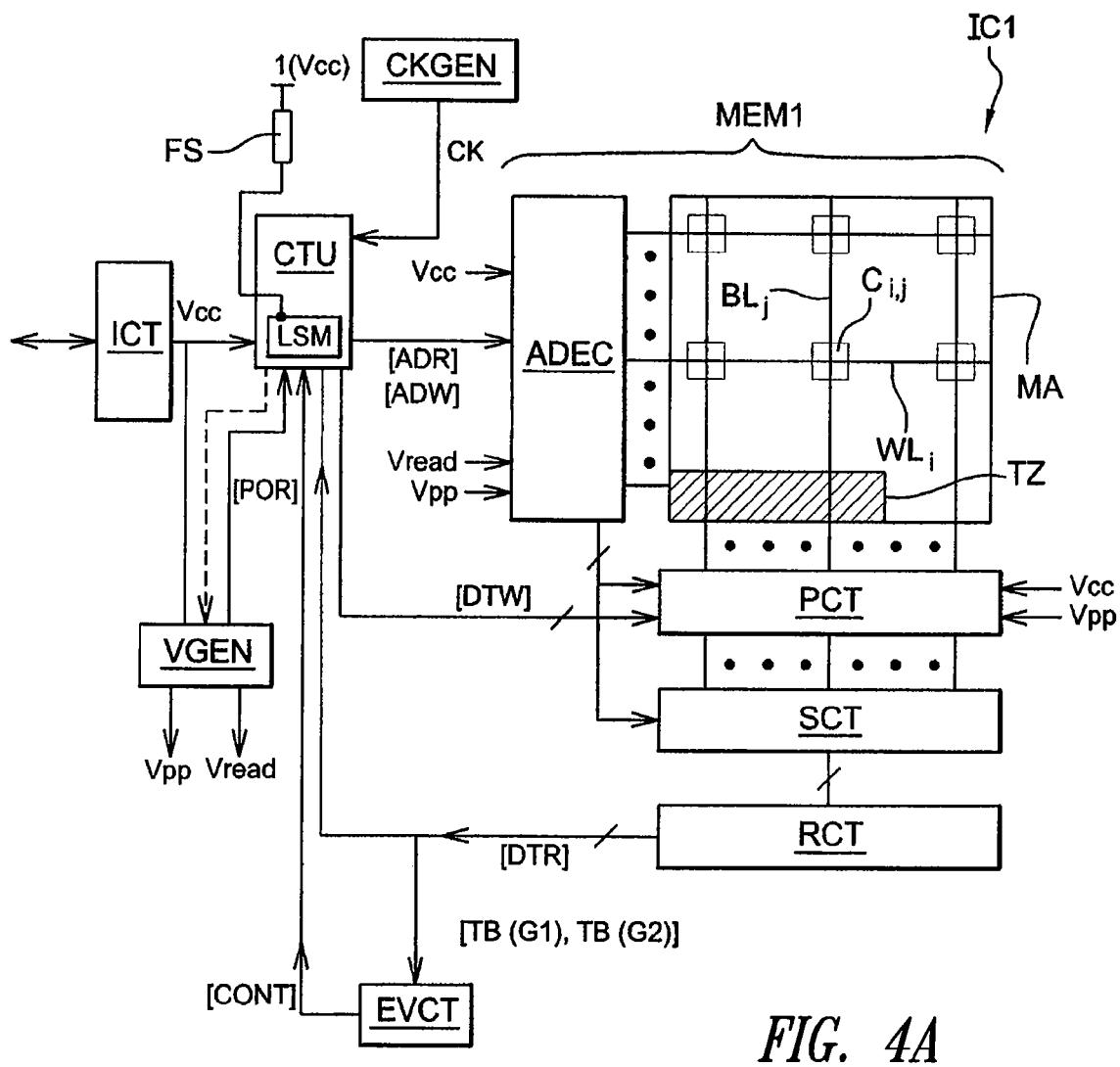

FIG. 4A schematically shows an architecture of an integrated circuit IC1 comprising means for implementing a method according to one embodiment of the invention.

The integrated circuit comprises a communication interface circuit ICT, a control unit CTU, a memory MEM1 containing transaction data, a voltage generator VGEN and a circuit CKGEN providing a clock signal CK to the control unit CTU.

The memory MEM1 comprises a memory array MA, an address decoder ADEC, a programming circuit PCT, a selection circuit SCT and a read circuit RCT. The memory array MA comprises electrically erasable and programmable memory cells $C_{i,j}$ arranged according to horizontal and vertical lines and linked to word lines $WL_i$ and bit lines $BL_j$. The structure of each memory cell is for example the one described above in relation with FIG. 2.

The programming circuit PCT comprises erase-programming latches (not shown) linked to the bit lines of the memory array, selected by the decoder ADEC and receiving data DTW to be written in the memory array. The read circuit RDCT comprises one or more sense amplifiers linked to the bit lines of the memory array MA by means of the selection circuit SCT and providing data DTR read in the memory array.

The circuit ICT ensures the link between the control unit CTU and the exterior of the integrated circuit, in order to receive commands and to send replies to commands, in particular commands for reading or writing in the memory. The circuit ICT can be of the contact type and simply comprise one line of electrical contacts. The circuit ICT can also be of the contactless or "RFID" (Radio Frequency Identification) type. In that case, the circuit ICT comprises circuits for sending/receiving radio frequency data (antenna circuit, modulation circuit, demodulation circuit . . . ) which comply with standards in force like ISO/IEC 14443A/B, ISO/IEC 13693 or comply with industrial specifications in the course of standardization like the specification EPC™-GEN2 ("*Radio-Frequency Identity Protocols Class-1 Generation-2—UHF RFID Protocol for Communications at 860 MHz-960 MHz*").

The circuit ICT also supplies a supply voltage Vcc to the integrated circuit IC1. The voltage Vcc is received via an electrical contact (contact embodiment) or is extracted from a carrier alternating signal emitted by a reader of contactless integrated circuit (contactless or RFID embodiment). Thus, the voltage Vcc appears each time the integrated circuit is used to perform a transaction, after the integrated circuit has been inserted in a contact reader card or when it is in the presence of a magnetic or electromagnetic field emitted by a contactless reader.

The generator VGEN is controlled by the unit CTU and supplies a read voltage Vread and an erase-programming voltage Vpp. The generator VGEN also automatically supplies a POR signal at powering on the integrated circuit, when the voltage Vcc appears. The POR signal or "Power On Reset" is applied to the control unit CTU to reset it. The POR signal for example goes from 0 to 1 (active value) during a determined duration defining a reset phase of the integrated circuit, then goes back to 0. Thus, the control unit CTU is here reset each time the integrated circuit is powered on.

The control unit CTU comprises wired-logic state machine LSM designed to execute the commands received via the circuit ICT. For example, upon reception of a write command of the type "WRITE-ADW-DTW", the unit CTU applies to the decoder ADEC a read address ADW included in the command, applies to the programming circuit PCT data DTW to be written in the memory array MA, also included in the command, applies the voltage Vpp to the circuit PCT and to the decoder ADEC, and triggers an erase and programming cycle of memory cells. Upon reception of a read command of the type "READ-ADR", the unit CTU applies to the decoder ADEC a read address ADR included in the command, applies the voltage Vread to the decoder ADEC, reads data DTR at the output of the circuit RCT and sends these data in a reply to the command, via the circuit ICT.

According to one embodiment of the invention, the integrated circuit IC1 comprises two groups G1, G2 of reference memory cells TC(G1), TC(G2), each group comprising at least one reference memory cell. Here, these memory cells TC(G1), TC(G2) are arranged in an allocated area TZ of the memory array and can be read by the read circuit RCT. An evaluation circuit EVCT, here of the wired-logic type, is connected to the output of the read circuit RCT so as to test the content of the reference memory cells. The circuit EVCT supplies a signal CONT ("continue") with a default value equal to 0 for example. Although it is here represented as distinct from the control unit CTU, this circuit can in practice be integrated in the control unit.

When putting the integrated circuit into service, the reference memory cells of a group, for example the cells TC(G1) of the group G1, are configured in the erased state, and the reference memory cells TC(G2) of the other group G2 are configured in the programmed state.

The state machine LSM of the control unit CTU is configured to execute as a priority a read and evaluation sequence of the memory cells TC(G1), TC(G2) after it has been reset by the POR signal, and then to switch to a blocking state if signal CONT does not have a positive evaluation value, for example the value 1 if the default value of this signal is 0. This read and evaluation sequence of the reference memory cells is unconditionally provided in the state change cycles of the state machine LSM and cannot be evaded, except during a phase for putting the integrated circuit into service during which the reference memory cells are configured. At the end of the phase for putting the integrated circuit into service, an action is performed to render the read and evaluation sequence indispensable. Here, this action is the fuse FS blow shown in FIG. 4A. The fuse FS is initially in the conducting state and applies the logic value 1 (Vcc) to an input of the state machine LSM. As long as the fuse has not blown, the state machine LSM does not execute the read and evaluation sequence. When the fuse has blown, the read and evaluation sequence is permanently activated as a priority sequence to be performed after each reset.

Figure 5:
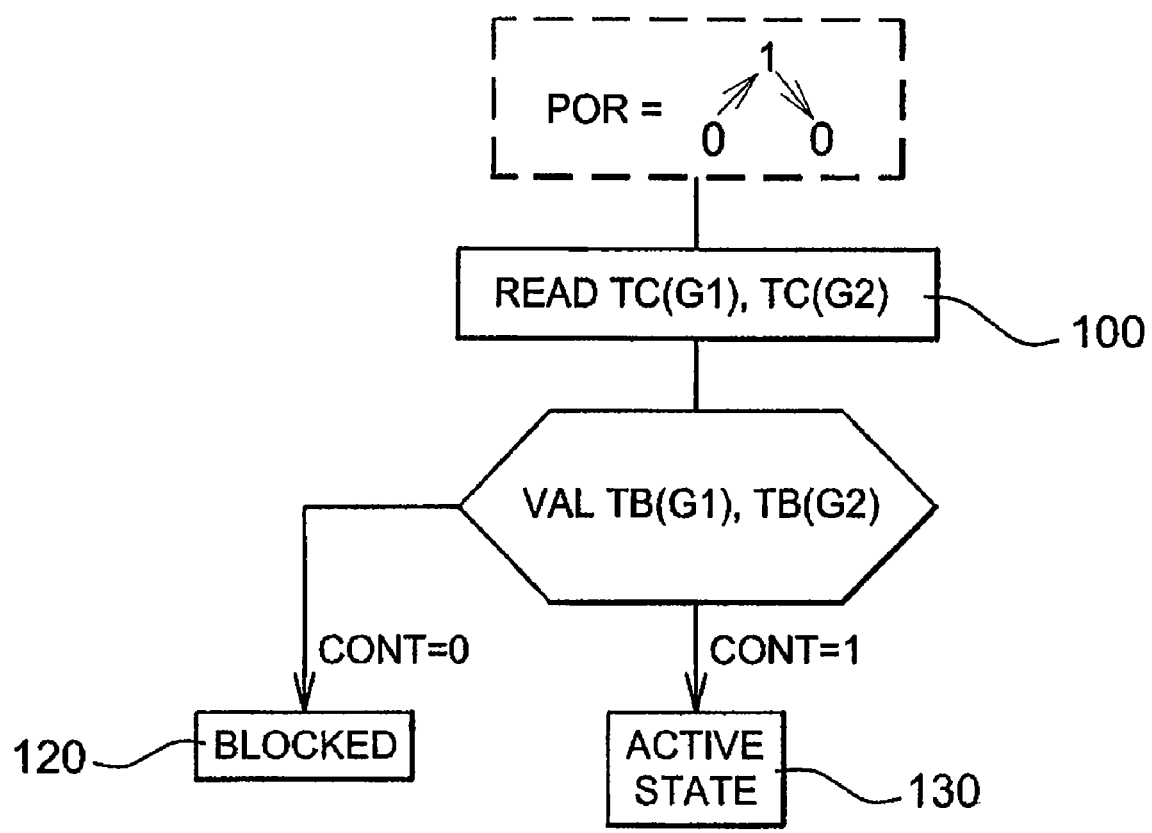
FIG. 5 is a diagram describing steps of a method according to one embodiment of the invention.

The read and evaluation sequence of the reference memory cells is shown by a diagram in FIG. 5 and comprises steps 100, 110, 120 and 130.

Step 100 ("READ TC(G1), TC(G2)"), that is a step of reading reference memory cells of each group, is performed by the control unit CTU after the POR signal goes from 1 to 0 (end of the reset period). The unit CTU applies the address of the memory area TZ to the address decoder ADEC and activates the read circuit RCT. The latter provides reference bits TB(G1), TB(G2) read in the reference memory cells of each group.

At step 110 ("VAL TB(G1), TB(G2)"), the evaluation circuit EVCT determines if the reference bits TB(G1), TB(G2) form together an authorized combination. If yes, the circuit EVCT sets the signal CONT to 1, if not the circuit EVCT leaves the signal CONT at 0.

If the signal CONT remains 0, the state machine LSM of the control unit CTU is redirected to step 120 ("BLOCKED") which corresponds to a blocking state during which it does not perform any operation, so that the integrated circuit is totally blocked until it is being powered on again.

If the signal CONT goes to 1, the control unit CTU goes to step 130 ("ACTIVE STATE") where it goes into an active state. This active state can consist of awaiting a command, the integrated circuit being ready to execute a transaction, or comprises operations to be performed before executing the first command (for example check if the memory array MA still contains not used units).

According to one embodiment of the invention, the test of the reference memory cells TC(G1), TC(G2) by the circuit EVCT makes it possible to determine whether the integrated circuit has been subjected to a global erasure by UV (or any particle beam having the effect of setting the memory cells into the UV state, Cf. curve CUV in FIG. 3). Indeed, the reference memory cells TC(G1) of the group G1 being configured in the erased state and the reference memory cells TC(G2) of the group G2 being configured in the programmed state, the reference bits TB(G1) of the group G1 and the reference bits TB(G2) of the group G2 should in principle have inverse binary values, for example "0" for the bits TB(G1) and "1" for the bits TB(G2). On the contrary, and particularly if these bits are equal, a UV erasure is suspected.

Table 1 below shows the implementation of the method described above invention when two reference memory cells TC1, TC2 are provided, the cell TC1 being erased and the cell TC2 being programmed at putting the integrated circuit into service. The combination expected at reading the reference memory cells is thus "01" if the logic value of a programmed memory cell is "1". The signal CONT remains 0 if the bits TB1, TB2 read in the reference memory cells TC1, TC2 are identical, that is, if they are both equal to 1 or equal to 0, which is considered here as meaning that the integrated circuit has been exposed to a particle beam having altered their initial states. The reading of the combination "10", inverse of the expected combination 01, is also considered as suspect and the signal CONT also remains 0 if this combination is read in the reference memory cells.

The circuit EVCT can be simply achieved under the form of a combinational logic circuit implementing a logic function of evaluation "Fev" such that: CONT=Fev(TB(G1),TB(G2)).

TABLE 1

| Combination read | Group G1 TB1 | Group G2 TB2 | CONT = Fev(TB1, TB2) |
|---|---|---|---|
| 0 | 0 | 0 | 0 |
| 1 (initial state) | 0 | 1 | 1 |
| 2 | 1 | 0 | 0 |
| 3 | 1 | 1 | 0 |

Figure 4B:
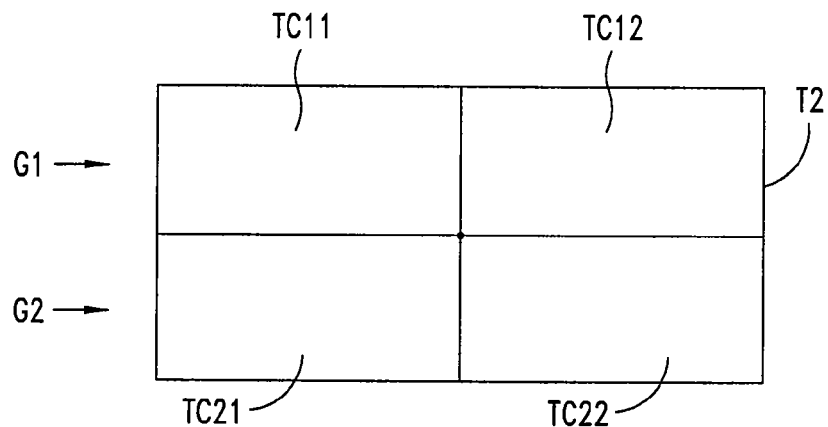

Table 2 below shows the implementation of one embodiment of the invention when four reference memory cells TC11 (group G1), TC12 (group G1), TC21 (group G2), TC22 (group G2) are used (FIG. 4B). At putting the integrated circuit into service, the cells TC11, TC12 are erased (writing of a 0) and the cells TC21, TC22 are programmed (writing of a 1). The combination expected at reading the memory cells, formed by reference bits TB11, TB12, TB21, TB22, is thus 0011 (i.e., 3h in hex notation).

This embodiment with four memory cells offers a great flexibility of implementation of the invention because it makes it possible to tolerate retention loss in the memory cells floating gates, which modify their initial states, without causing the integrated circuit to block.

To that purpose, several tolerance levels are conceivable:

tolerance level 0 (no tolerance): the signal CONT is set to 1 if and only if the combination of bits read in the reference memory cells is equal to 0011 (initial state), tolerance level 1: the signal CONT is also set to 1 if only one bit of the reference bits has a value different from the expected value. An evaluation with tolerance level 1 is shown in Table 2: the combinations 1h, 2h, 7h, Bh (hex notation) are considered as true and the signal CONT is set to 1.

tolerance level 2: the signal CONT is also set to 1 if only one bit in each group has a value different from the expected value. The corresponding combinations are marked by "*" in Table 2: the combinations 5h, 6h, 9h, Ah would be considered as true and the signal CONT would be set to 1 if the tolerance level 2 was retained. However, two faulty reference memory cells out of four being little likely, an evaluation of the reference memory cells with tolerance level 1 is preferred.

In any case, whatever the tolerance level to the retention loss, the fact that all the memory cells of a group G1 or G2 have bits whose values are the inverse of the expected values (here 0h, 4h, 8h, Ch, Dh, Eh, Fh) causes the signal CONT to remain 0 and the integrated circuit to block.

TABLE 2

| Combination read | Group G1 TB11 | Group G1 TB12 | Group G2 TB21 | Group G2 TB22 | CONT = Fev(TB11-TB22) |
|---|---|---|---|---|---|
| 0h | 0 | 0 | 0 | 0 | 0 |
| 1h | 0 | 0 | 0 | 1 | 1 |
| 2h | 0 | 0 | 1 | 0 | 1 |
| 3h (initial state) | 0 | 0 | 1 | 1 | 1 |
| 4h | 0 | 1 | 0 | 0 | 0 |
| 5h | 0 | 1 | 0 | 1 | 0 (*) |
| 6h | 0 | 1 | 1 | 0 | 0 (*) |
| 7h | 0 | 1 | 1 | 1 | 1 |
| 8h | 1 | 0 | 0 | 0 | 0 |
| 9h | 1 | 0 | 0 | 1 | 0 (*) |
| Ah | 1 | 0 | 1 | 0 | 0 (*) |
| Bh | 1 | 0 | 1 | 1 | 1 |
| Ch | 1 | 1 | 0 | 0 | 0 |
| Dh | 1 | 1 | 0 | 1 | 0 |
| Eh | 1 | 1 | 1 | 0 | 0 |
| Fh | 1 | 1 | 1 | 1 | 0 |

An advantage of the method described above is to not require a memory cell read voltage superior to the threshold voltage of memory cells in the UV state. In particular, the read voltage Vread can advantageously be equal to 0, so that the step of reading the reference memory cells (FIG. 5) as well as steps of reading the memory array MA can be rapidly performed without waiting for the stabilization of the voltage Vread.

With reference to FIG. 3, after a UV erasure, the threshold voltage of memory cells initially programmed (i.e., the reference memory cells of the group G2 and the memory cells containing used units) is assumed to remain under 0 in spite of the UV erasure. In that case, the sequence for reading and evaluating the reference memory cells will not detect the UV erasure but the memory cells containing used units will keep on being seen in the programmed state. However, if the threshold voltage of memory cells initially in the programmed state becomes superior to 0 after the UV erasure, all the data read in the reference memory cells are equal to 0 and the integrated circuit blocks at the end of the sequence for reading and evaluating the reference memory cells.

Although one embodiment of the invention comprises the use of a same read voltage for reading each type of memory cells, and preferably a voltage equal to zero, those skilled in the art will note that the invention can nevertheless be implemented with different voltages for reading reference memory cells and for reading memory cells containing data. In addition, the reference memory cells could be read by two read voltages for resolving ambiguous cases like the reading of the combinations 5h, 6h, 9h, Ah in the four reference memory cells (Table 2) or the combination "10" in the two reference memory cells (Table 1). However, this reading with two levels of voltages would be rare and only used in unlikely ambiguous situations.

Figure 6:
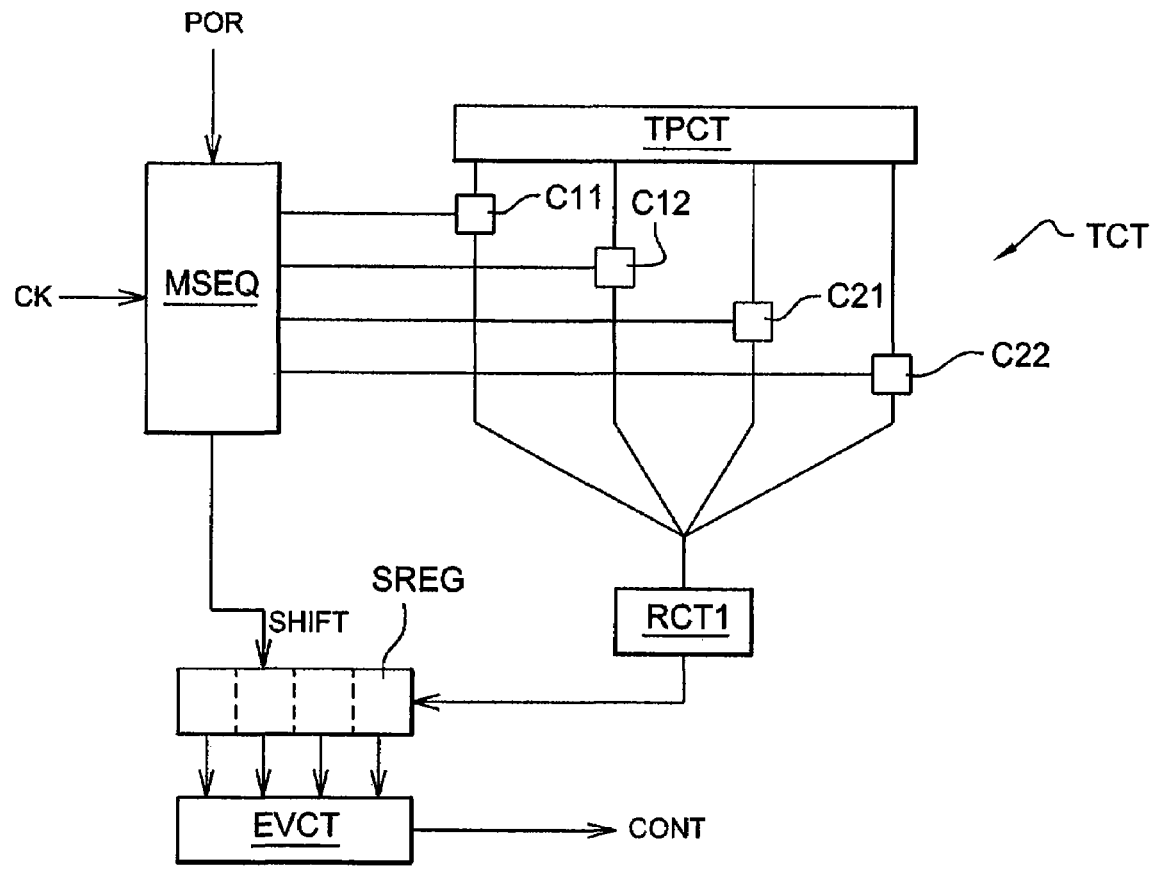
FIG. 6 shows an embodiment of the means for implementing the method of the invention.

In addition, the reference memory cells are not necessarily arranged in the memory array as previously described. For better understanding, FIG. 6 shows a reference circuit TCT according to one embodiment of the invention which is autonomous and distinct from the control unit CTU and the memory array MA. The circuit TCT for example comprises:

reference memory cells independent from the memory array MA, for example two or four reference memory cells, here four reference memory cells C11, C12, C21, C22, a circuit TPCT for programming reference memory cells, upon putting the integrated circuit into service, a read circuit RCT1 linked to the four memory cells, a wired-logic microsequencer MSEQ, clocked by the clock signal CK, which selects the memory cells to be read one after the other, after the POR signal goes from 1 to 0, a shift register SREG receiving the reference bits read in the reference memory cells on one serial input, and is driven by a shift signal SHIFT supplied by the microsequencer MSEQ, and the evaluation circuit EVCT described above, here having inputs connected to the parallel outputs of the register SREG and an output supplying the signal CONT.

In one embodiment of the invention, the control unit CTU is provided for executing a command for putting the integrated circuit out of service. This command, known in itself and usually called "KILL" command, is provided in some applications in order to render the integrated circuit unusable after a transaction, for example after the units contained in the memory have been completely used or after a product identified by the integrated circuit has passed at the cash desk (example application: electronic tag without units counter, the transaction data being used for example to identify the product and define its price). In previous practice, the command KILL is usually executed by modifying the value of a flag in a configuration register of the integrated circuit (state register), which locks the control unit.

Here, the means allowing an UV erasure of transaction data to be detected are used to implement the command KILL. Thus, upon reception of this command, the control unit CTU accesses the reference memory cells present in the reference memory area TZ (FIGS. 4A, 4B) or in the circuit TCT (FIG. 6) and writes a predefined datum which corresponds to a forbidden combination causing the signal CONT to remain 0 at powering on the integrated circuit. This forbidden combination is preferably the inverse of the initial combination. For example, when four reference memory cells are used, the forbidden combination is "1100" (Cf. Table 2).

It will be clear to those skilled in the art that the present invention is susceptible to various different embodiments.

Particularly, the control unit CTU can be a microprocessor which executes as a priority a subprogram for reading and evaluating memory cells after each microprocessor reset. This subprogram is preferably protected against violations by being stored in a non-erasable memory of the ROM type. The reference circuit TCT shown in FIG. 6 can also be used in combination with a microprocessor, to avoid using a subprogram. With a microprocessor control unit, the signal CONT at 0 can be used as a priority interruption signal which sends the microprocessor in a subprogram for blocking or resetting the microprocessor ("Soft Reset").

In addition, it has been suggested above that the reference memory cells are read and evaluated each time the integrated circuit is powered on. It is in principle enough in the applications where the integrated circuit is of the passive type and is powered only when it is used for a transaction. In applications where the integrated circuit is powered by an autonomous power supply (battery), the read and evaluation sequence can be repeated in a cyclical way, for example with regular time intervals defined by a counter or each time the integrated circuit receives an executable command, before executing the command.

The present invention is also susceptible to various applications other than protection against the erasure of transaction data having a monetary value. The invention is particularly applicable to the protection of confidential data, passwords, identification data, etc.

The invention is also applicable to various types of non-volatile memories, in particular the Flash memories whose memory cells have no access transistor.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The invention claimed is:

1. An integrated circuit comprising:
    an electrically programmable data memory having a plurality of memory cells;
    a control unit for executing commands for reading or writing in the memory;
    first and second groups of electrically programmable reference memory cells, each group comprising at least one reference memory cell; and
    blocking means for blocking the integrated circuit if the reference memory cells of the two groups contain bits of the same value.

2. The integrated circuit according to claim 1, wherein:
    the first and second groups respectively consist of first and second reference memory cells; and
    the blocking means blocks the integrated circuit if the first and second reference memory cells contain bits of the same value.

3. The integrated circuit according to claim 1, wherein:
    each group comprise plural reference memory cells; and
    the blocking means blocks the integrated circuit if all the reference memory cells of one of the groups contain bits of equal value and if the equal value is different from a value expected for the one of the groups.

4. The integrated circuit according to claim 1, wherein:
    each group comprises plural reference memory cells; and
    the blocking means blocks the integrated circuit if one of the reference memory cells of the first group contains a bit having a value that is different from a value expected for the reference memory cells of the first group, and if one of the reference memory cells of the second group contains a bit which value is different from a value expected for the reference memory cells of the second group.

5. The integrated circuit according to claim 4, wherein the value expected for the bits contained in the reference memory cells of the first group is the inverse of the value expected for the bits contained in the reference memory cells of the second group.

6. The integrated circuit according to claim 1, wherein the blocking means comprise means for reading and means for evaluating the reference memory cells, the blocking means being activated as a priority at powering on the integrated circuit and providing a block signal for blocking the control unit if the reference memory cells contain a forbidden combination of bits.

7. The integrated circuit according to claim 6, wherein the means for evaluating reference memory cells comprise a wired-logic circuit implementing a logic function of evaluation.

8. The integrated circuit according to claim 1, comprising:
means for storing an authorized combination of bits in the reference memory cells at putting the integrated circuit into service; and
means for subsequently preventing the writing of the reference memory cells.

9. The integrated circuit according to claim 1, wherein the control unit is configured to execute a command for writing a forbidden combination of bits in the reference memory cells, so as to put the integrated circuit out of service.

10. The integrated circuit according to claim 1, wherein the memory cells of the data memory and reference memory cells comprise floating gate transistors and each floating gate transistor is read by applying a read voltage equal to zero to the floating gate transistor.

11. The integrated circuit according to claim 1, wherein the data memory comprises a memory array and the reference memory cells are arranged in an allocated area of the memory array.

12. A method for protecting against a global data erasure an integrated circuit, including an electrically programmable data memory and a control unit to execute commands for reading and writing the memory, the data memory having a plurality of memory cells, the method comprising:
providing in the integrated circuit first and second groups of electrically programmable reference memory cells, each group having at least one reference memory cell;
storing in the at least one reference memory cell of the first group a bit having a first value, and storing in the at least one reference memory cells of the second group a bit having a second value which is the inverse of the first value, the bits of the first and second groups together forming an authorized combination of bits, said storing taking place when the integrated circuit is put into service; and
reading and evaluating the reference memory cells during the operation of the integrated circuit after powering it on, and blocking the integrated circuit if the reference memory cells contain a forbidden combination of bits different from the authorized combination.

13. The method according to claim 12, wherein a combination of bits is forbidden if the bit of the at least one reference memory cell of the first group is of the same value as the bit of the at least one reference memory cell of the second group.

14. The method according to claim 12, wherein each of the groups includes plural reference memory cells and wherein a combination of bits is forbidden if all the reference memory cells of the first group contain bits having the second value and/or if all the memory cells of the second group contain bits having the first value.

15. The method according to claim 12, wherein a combination of bits is forbidden if the at least one reference memory cell of the first group contains at least one bit having the second value and if the at least one reference memory cell of the second group contains at least one bit having the first value.

16. The method according to claim 12, wherein blocking the integrated circuit comprises blocking the control unit so that the control unit no longer executes any command.

17. The method according to claim 12, wherein the integrated circuit is authorized to execute, after putting the integrated circuit into service, a kill command for writing to the reference memory cells so as to allow the integrated circuit to be voluntarily blocked.

18. The method according to claim 12, wherein the data memory comprises a memory array and wherein memory cells of an area of the memory array are used as the reference memory cells.

19. The method according to claim 12 wherein each memory cell of the data memory and each reference memory cell comprises a floating gate transistor, and wherein the memory cells are read by a read voltage equal to zero.

20. The method according to claim 12, wherein the reference memory cells are read and evaluated each time the integrated circuit is powered on after putting it into service.

21. The method according to claim 12, wherein the evaluation of memory cells is performed by means of a wired-logic circuit implementing a logic function of evaluation.

22. An integrated circuit comprising:
a memory having an array of memory cells;
two groups of reference memory cells, each group having at least one reference memory cell; and
a control unit configured to execute a blocking command if the reference memory cells contain a forbidden combination of bits.

23. The integrated circuit according to claim 22 wherein each group comprises one reference memory cell.

24. The integrated circuit according to claim 23 wherein a combination of bits is forbidden when any bit is different from an expected value.

25. The integrated circuit according to claim 22 wherein each group comprises two reference memory cells.

26. The integrated circuit according to claim 25 wherein a combination of bits is forbidden when any bit is different from an expected value.

27. The integrated circuit according to claim 25 wherein a combination of bits is forbidden when more than one bit is different from an expected value.

28. The integrated circuit according to claim 23 wherein the reference memory cells are located in the array of memory cells.

29. The integrated circuit according to claim 23 wherein the control unit is configured to execute a kill command wherein the forbidden combination of bits is written to the reference memory cells.

30. The integrated circuit according to claim 23 wherein the reference memory cells are independent of the array of memory cells, the integrated circuit comprising:
a reference cell program circuit configured to program the reference memory cells;
a read circuit coupled to the reference memory cells;
a wired-logic microsequencer, clocked by a clock signal CK, which selects the memory cells to be read one after an other;

a shift register configured to receive reference bits read in the reference memory cells, the shift register being driven by a shift signal supplied by the microsequencer; and an evaluator configured to determine if a combination of bits received by the shift register is forbidden.

31. A method for protecting an integrated circuit having an array of memory cells and a control unit configured to execute commands for reading and writing in the memory, the method comprising:

provic groups of reference memory cells in the integrated circuit; and programming the control unit to block function of the integrated circuit if a forbidden combination of bits are stored in the reference cells.

32. The method according to claim 31 wherein the number of reference memory cells in a group is 1.

33. The method according to claim 32 wherein a combination of bits is forbidden if one bit is different from an expected value.

34. The method according to claim 31 wherein the number of reference memory cells in a group is two.

35. The method according to claim 34 wherein a combination of bits is forbidden if one bit is different from an expected value.

36. The method according to claim 34 wherein a combination of bits is forbidden if more than one bit is different from an expected value.

37. The method according to claim 31 comprising:

providing means for writing an authorized combination of bits to the reference memory cells upon first powering on the integrated circuit.

38. The method according to claim 37 comprising:

providing circuitry configured to prevent the writing of bits to the reference cells after writing an authorized combination of bits to the reference cells upon first powering on the integrated circuit.

39. The method according to claim 31, wherein the reference memory cells are read and evaluated each time the integrated circuit is powered on after first powering on the integrated circuit.

40. The method according to claim 31, wherein the evaluation of reference memory cells is performed by means of a wired-logic circuit implementing a logic function of evaluation.

41. The method according to claim 31 comprising:

enabling the integrated circuit to execute a kill command for writing a forbidden combination of bits to the reference memory cells.

* * * * *